(12) United States Patent
Bandhu et al.

(10) Patent No.: US 9,426,888 B2
(45) Date of Patent: Aug. 23, 2016

(54) SUBSTRATE FOR MOUNTING ELECTRICAL CONNECTOR

(71) Applicant: 3M INNOVATIVE PROPERTIES COMPANY, St. Paul, MN (US)

(72) Inventors: Saujit Bandhu, Singapore (SG); YunLong Qiao, Singapore (SG); Vincent Tan, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/649,628

(22) PCT Filed: Jan. 8, 2014

(86) PCT No.: PCT/US2014/010584
§ 371 (c)(1),
(2) Date: Jun. 4, 2015

(87) PCT Pub. No.: WO2014/110068
PCT Pub. Date: Jul. 17, 2014

(65) Prior Publication Data
US 2015/0319861 A1    Nov. 5, 2015

Related U.S. Application Data

(60) Provisional application No. 61/751,302, filed on Jan. 11, 2013.

(51) Int. Cl.
*H05K 1/03* (2006.01)
*H05K 1/09* (2006.01)
(Continued)

(52) U.S. Cl.
CPC .............. *H05K 1/117* (2013.01); *H01R 12/721* (2013.01); *H05K 1/0228* (2013.01); *H05K 1/111* (2013.01); *H05K 2201/10189* (2013.01)

(58) Field of Classification Search
CPC ...... H05K 1/117; H05K 1/0228; H05K 1/111; H05K 2201/10189; H01R 12/721
USPC ............................... 174/255, 257, 261; 439/79
See application file for complete search history.

(56) References Cited

U.S. PATENT DOCUMENTS 6,589,061 B1   7/2003 Korsunsky et al.
6,728,111 B1 * 4/2004 Ku .................... H01R 12/725
                                                361/679.32
(Continued)

FOREIGN PATENT DOCUMENTS

GB    2341980       3/2000
JP    2006-313697   11/2006
(Continued)

OTHER PUBLICATIONS

PCT International Search Report from PCT/US2014/010584, mailed May 27, 2014, 3 pages.

*Primary Examiner* — Sherman Ng
(74) *Attorney, Agent, or Firm* — Robert S. Moshrefzadeh

(57) ABSTRACT

A substrate comprises a first plurality of conductive pads disposed on a first side of the substrate and a different second plurality of conductive pads disposed on the first side of the substrate. Each conductive pad in the first plurality of conductive pads is configured to make electrical contact with a corresponding contact of a MicroSAS plug connector when the MicroSAS plug connector is mounted onto the substrate. Each conductive pad in the second plurality of conductive pads is configured to make electrical contact with a corresponding contact of a MicroSATA plug connector when the MicroSATA plug connector is mounted onto the substrate. At least one conductive pad belongs to both the first and second pluralities of conductive pads.

15 Claims, 6 Drawing Sheets

(51) Int. Cl.
*H05K 1/11* (2006.01)
*H01R 12/00* (2006.01)
*H01R 12/72* (2011.01)
*H05K 1/02* (2006.01)

(56) References Cited

U.S. PATENT DOCUMENTS

| | | | |
|---|---|---|---|
| 8,007,289 B2 * | 8/2011 | Bandhu | H01R 13/6271 |
| | | | 439/638 |
| 8,315,066 B2 * | 11/2012 | Chen | G06F 1/185 |
| | | | 361/763 |
| 8,337,218 B2 | 12/2012 | Hirata et al. | |
| 2011/0063790 A1 | 3/2011 | Park et al. | |
| 2011/0097936 A1 | 4/2011 | Hirata | |
| 2012/0077385 A1 * | 3/2012 | Qiao | H01R 27/02 |
| | | | 439/628 |
| 2012/0108109 A1 * | 5/2012 | Zhang | H01R 12/721 |
| | | | 439/629 |

FOREIGN PATENT DOCUMENTS

| | | |
|---|---|---|
| JP | 2007-109994 | 4/2007 |
| JP | 2008-193108 | 8/2008 |
| JP | 2012-69397 | 4/2012 |

* cited by examiner

SUBSTRATE FOR MOUNTING ELECTRICAL CONNECTOR

CROSS-REFERENCE TO RELATED APPLICATIONS

This application claims the priority of U.S. Provisional Patent Application Ser. No. 61/751,302, filed 11 Jan. 2013, the contents of which are hereby incorporated by reference.

TECHNICAL FIELD

The present disclosure relates generally to substrates for mounting electrical connectors, in particular MicroSATA or MicroSAS connectors.

BACKGROUND

Hard disk drives are used to store digital data content for laptops, desktop computers, servers, and other electronic devices. Each of these electronic devices has its own requirements for the hard disk drive to be used, such as, e.g., access time, capacity, form factor, reliability, and data transmission rates.

A hard disk drive interface is the communication channel over which data flows as it is read from or written to the hard disk drive. Types of interfaces currently available include Integrated Drive Electronics (IDE), Advanced Technology Attachment (ATA), Small Computer System Interface (SCSI), Serial Attached ATA (SATA), and Serial Attached SCSI (SAS). This list of interfaces is not exhaustive and is constantly expanding to keep pace with the changing demands of the electronic devices that dictate the specifications of the hard disk drives and their interfaces.

SATA and SAS connectors are common types of connectors used in hard disk drive interfaces. According to the specifications set by the Small Form Factor (SFF) Committee, SATA connectors have 22 contacts of which 15 contacts ("power contacts") are used for power transmission and 7 contacts ("primary port contacts") are used for data signal transmission. In addition to the 22 contacts available in SATA connectors, SAS connectors have an additional 7 contacts ("secondary port contacts") for data signal transmission.

Along with the continuing desire to have electronic devices that are physically smaller, have more computing power, and have faster processors comes the need to have hard disk drives that match these requirements. Thus, there is an industry need to have hard disk drive connectors with a smaller form factor (i.e., physical size) that are capable of handling high-speed (e.g., 6 Gbps) data transfer. Examples of such connectors include MicroSATA and MicroSAS connectors. MicroSATA and MicroSAS connectors have the same number of data signal contacts as SATA and SAS connectors, respectively. However, because MicroSATA and MicroSAS hard disk drives are physically smaller and consume less power than SATA and SAS hard disk drives, respectively, MicroSATA and MicroSAS connectors only require 9 power contacts. MicroSAS connectors have an additional 2 contacts ("auxiliary contacts") for diagnostic or auxiliary use.

MicroSATA and MicroSAS connectors currently available in the market generally require a different layout of conductive pads (or "footprint") on a mounting substrate, such as, e.g., a printed circuit board. In addition, MicroSAS connectors currently available in the market generally require a mounting substrate whereby conductive pads are disposed on both sides of the substrate.

SUMMARY

In at least one aspect, the present invention provides a substrate comprising a first plurality of conductive pads disposed on a first side of the substrate and a different second plurality of conductive pads disposed on the first side of the substrate. Each conductive pad in the first plurality of conductive pads is configured to make electrical contact with a corresponding contact of a MicroSAS plug connector when the MicroSAS plug connector is mounted onto the substrate. There is a one-to-one correspondence between the contacts in the MicroSAS plug connector and the conductive pads in the first plurality of conductive pads. Each conductive pad in the second plurality of conductive pads is configured to make electrical contact with a corresponding contact of a MicroSATA plug connector when the MicroSATA plug connector is mounted onto the substrate. There is a one-to-one correspondence between the contacts in the MicroSATA plug connector and the conductive pads in the second plurality of conductive pads. At least one conductive pad belongs to both the first and second pluralities of conductive pads.

In at least one aspect, the present invention provides a plastic cover for covering at least portions of contact tails of a surface mount connector. The plastic cover comprises a top surface and a structured bottom surface comprising a plurality of elongated spaced apart parallel ridges defining a plurality of elongated parallel channels therebetween. The channels extend from a front side of the plastic cover toward an opposite back side of the plastic cover. Each channel corresponds to a different contact tail of the surface mount connector and is configured to cover the contact tail along at least a portion of a length of the contact tail, such that when the surface mount connector is mounted, the plastic cover is placed in a position so that the back side of the plastic cover is near and along a mounting face of the surface mount connector resulting in each contact tail of the surface mount connector being housed within a different channel.

The above summary of the present invention is not intended to describe each disclosed embodiment or every implementation of the present invention. The details of one or more embodiments of the present invention are set forth in the accompanying drawings and the detailed description below. Other features, objects, and advantages of the invention will be apparent from the detailed description and drawings, and from the claims.

DETAILED DESCRIPTION

In the following detailed description of the preferred embodiments, reference is made to the accompanying drawings that form a part hereof The accompanying drawings show, by way of illustration, specific embodiments in which the invention may be practiced. It is to be understood that other embodiments may be utilized, and structural or logical changes may be made without departing from the scope of the present invention. The following detailed description, therefore, is not to be taken in a limiting sense, and the scope of the invention is defined by the appended claims.

In the illustrated embodiments, directional representations, i.e., up, down, left, right, front, rear and the like, used for explaining the structure and movement of the various elements of the present application, are relative. These representations are appropriate when the elements are in the position shown in the Figures. If the description of the position of the elements changes, however, it is assumed that these representations are to be changed accordingly. Throughout the Figures, like reference numbers denote like parts.

Exemplary embodiments of a substrate according to aspects of the present invention have numerous advantages. Advantages include that these substrates 1) enable fabrication of a "universal" substrate design having a conductive pad layout that can be used for mounting different electrical connectors, such as, e.g., MicroSATA and MicroSAS connectors, 2) enable electrical connectors, such as, e.g., MicroSATA and MicroSAS connectors, to be mounted to one side of the substrate, enabling cost-effective connector termination, such as, e.g., using a solder reflow process, and 3) enable various configurations of MicroSATA and MicroSAS connectors, such as, e.g., straddle mount, low profile surface mount, standard profile surface mount, and right angle configurations, to be mounted. Exemplary embodiments of a plastic cover according to aspects of the present invention have numerous advantages. Advantages include that these covers 1) provide shielding to electrical contacts of an electrical connector to which the cover is assembled, enabling higher data rates and better impedance matching, and 2) enable a less complex housing design of an electrical connector to which the cover is assembled, preventing thin housing walls and enabling electrical contact insertion without obstruction by thin housing walls before the cover is assembled. Further advantages will be described herein throughout.

Figure 1:
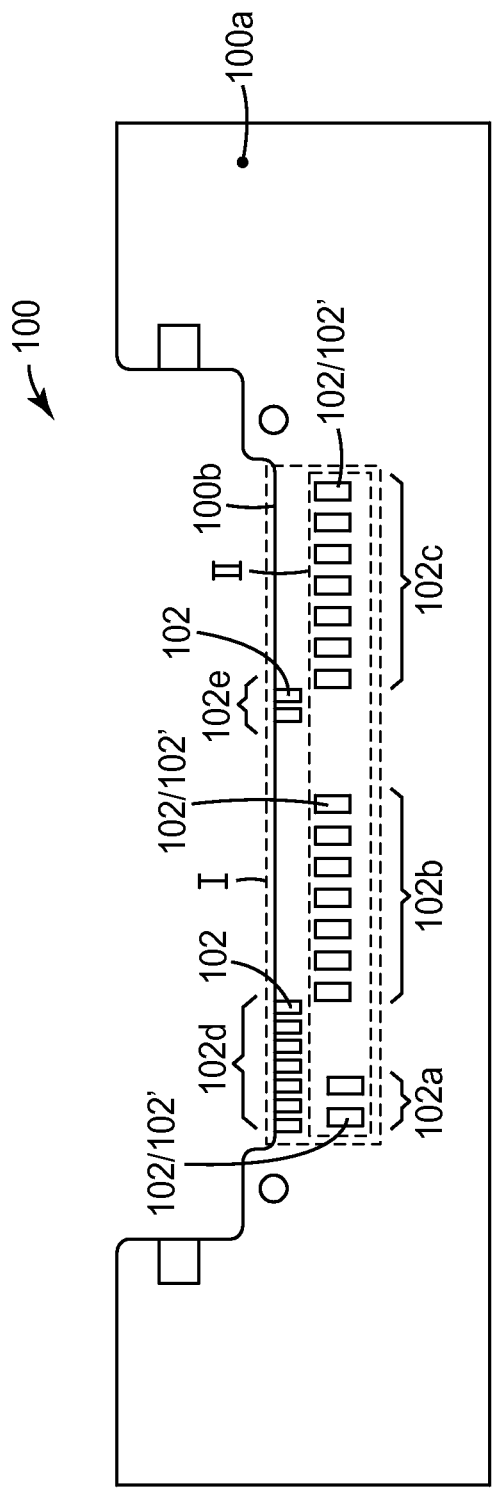
FIG. 1 is a top view of an exemplary embodiment of a substrate according to an aspect of the present invention.

Referring now to the Figures, FIG. 1 illustrates an exemplary embodiment of a substrate according to an aspect of the present invention. Substrate 100, which in at least one embodiment is a printed circuit board, includes a first plurality of conductive pads 102 disposed on a first side 100a of substrate 100. In the embodiment illustrated in FIG. 1, the first plurality of conductive pads 102 includes the conductive pads included in the group identified by dashed outline I, which includes two conductive pads 102a, seven conductive pads 102b, seven conductive pads 102c, seven conductive pads 102d, and two conductive pads 102e. Each conductive pad in the first plurality of conductive pads 102 is configured to make electrical contact with a corresponding contact of a MicroSAS plug connector 200 (illustrated in FIG. 2) when MicroSAS plug connector 200 is mounted onto substrate 100. There is a one-to-one correspondence between the contacts in MicroSAS plug connector 200 and the conductive pads in the first plurality of conductive pads 102. In at least one aspect, two conductive pads 102a, seven conductive pads 102b, seven conductive pads 102c, seven conductive pads 102d, and two conductive pads 102e correspond to two power contacts P8-P9, seven power contacts P1-P7, seven primary port signal contacts S1-S7, seven secondary port signal contacts S8-S14, and two auxiliary contacts A1-A2, respectively, of MicroSAS plug connector 200.

Substrate 100 further includes a different second plurality of conductive pads 102' disposed on a first side 100a of substrate 100. In the embodiment illustrated in FIG. 1, the second plurality of conductive pads 102' includes the conductive pads included in the group identified by dashed outline II, which includes two conductive pads 102a, seven conductive pads 102b, and seven conductive pads 102c. Each conductive pad in the second plurality of conductive pads 102' is configured to make electrical contact with a corresponding contact of a MicroSATA plug connector 300 (illustrated in FIG. 3) when MicroSATA plug connector 300 is mounted onto substrate 100. There is a one-to-one correspondence between the contacts in MicroSATA plug connector 300 and the conductive pads in the second plurality of conductive pads 102'. In at least one aspect, two conductive pads 102a, seven conductive pads 102b, and seven conductive pads 102c correspond to two power contacts P8-P9, seven power contacts P1-P7, and seven primary port signal contacts S1-S7, respectively, of MicroSATA plug connector 300.

In substrate 100, at least one conductive pad belongs to both the first plurality of conductive pads 102 and the second plurality of conductive pads 102'. In the embodiment illustrated in FIG. 1, two conductive pads 102a, seven conductive pads 102b, and seven conductive pads 102c belong to both the first plurality of conductive pads 102 (i.e., the group of conductive pads identified by dashed outline I) and the second plurality of conductive pads 102' (i.e., the group of conductive pads identified by dashed outline II).

In at least one embodiment, each conductive pad in the first plurality of conductive pads 102 and the second plurality of conductive pads 102' is connected to a different conductive trace (not shown) disposed on substrate 100. In at least one aspect, this allows for individual electrically separated signal or power transmission from MicroSAS plug connector 200 or MicroSATA plug connector 300 to a corresponding device, such as, e.g., a hard disk drive, mounted on substrate 100.

In at least one embodiment, each conductive pad in the second plurality of conductive pads 102' is also a conductive pad in the first plurality of conductive pads 102. In the embodiment illustrated in FIG. 1, each conductive pad 102a, 102b, and 102c in the second plurality of conductive pads 102' (i.e., the group of conductive pads identified by dashed outline II) is also a conductive pad in the first plurality of conductive pads 102 (i.e., the group of conductive pads identified by dashed outline I).

In at least one embodiment, the conductive pads in the first plurality of conductive pads 102 and the second plurality of conductive pads 102' are arranged in first and second rows parallel to a first edge 100b of substrate 100. In the embodiment illustrated in FIG. 1, the first row of conductive pads includes conductive pads 102d and 102e and the second row of conductive pads includes conductive pads 102a, 102b, and 102c. The first row of conductive pads is disposed between first edge 100b and the second row of conductive pads.

Figure 2:
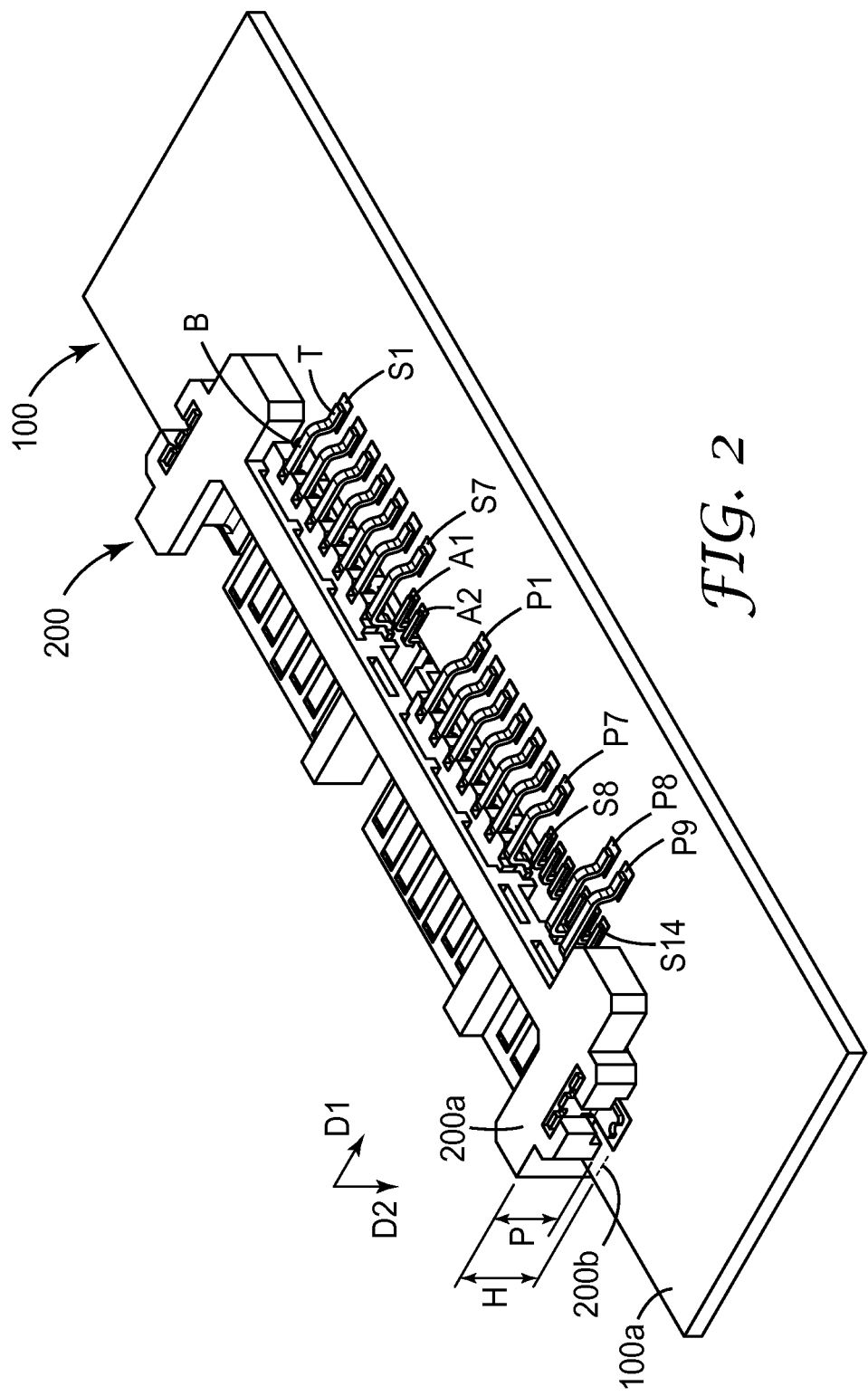
FIG. 2 is a top perspective view of an exemplary embodiment of a MicroSAS connector mounted on the substrate of FIG. 1.

In at least one aspect, as can be seen in FIG. 2, two power contacts P8-P9, seven power contacts P1-P7, and seven primary port signal contacts S1-S7 of MicroSAS plug connector 200 are arranged to correspond to the second row of conductive pads, and seven secondary port signal contacts S8-S14 and two auxiliary contacts A1-A2 of MicroSAS plug connector 200 are arranged to correspond to the first row of contact pads. To accommodate this arrangement of contact pads, contacts P8-P9, P1-P7, and S1-S7 of MicroSAS plug connector 200 have been adjusted. In at least one aspect, this adjustment includes an extension of the length of contact tails T of contacts P8-P9, P1-P7, and S1-S7 such that they can be terminated to their respective conductive pads 102a, 102b, and 102c, and the introduction of a substantially U-shaped bend region B in contact tails T to prevent interference with and create spacing from contacts S8-S14 and A1-A2.

Figure 3:
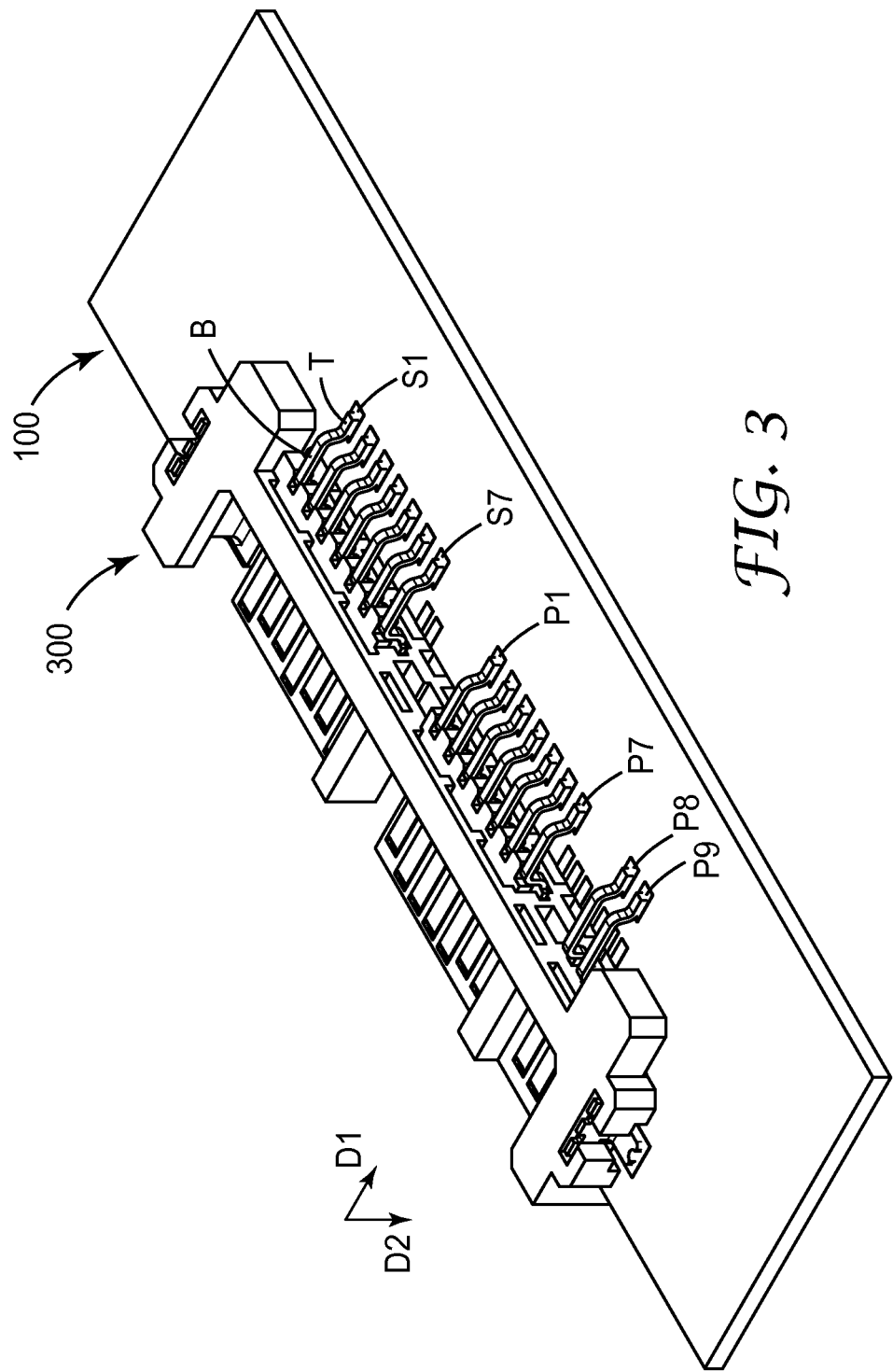
FIG. 3 is a top perspective view of an exemplary embodiment of a MicroSATA connector mounted on the substrate of FIG. 1.

In at least one aspect, as can be seen in FIG. 3, two power contacts P8-P9, seven power contacts P1-P7, and seven primary port signal contacts S1-S7 of MicroSATA plug connector 300 are arranged to correspond to the second row of conductive pads. To accommodate this arrangement of contact pads, contacts P8-P9, P1-P7, and S1-S7 of MicroSATA plug connector 300 have been adjusted as described above with respect to contacts P8-P9, P1-P7, and S1-S7 of MicroSAS plug connector 200.

Referring to FIG. 2, in at least one aspect, MicroSAS plug connector 200 is a straddle mount MicroSAS plug connector (not shown), wherein each conductive pad in the first plurality of conductive pads 102 is configured to make electrical contact with a corresponding contact of the straddle mount MicroSAS plug connector when the straddle mount MicroSAS plug connector is mounted onto substrate 100. Referring to FIG. 3, in at least one aspect, MicroSATA plug connector 300 is a straddle mount MicroSATA plug connector (not shown), wherein each conductive pad in the second plurality of conductive pads 102' is configured to make electrical contact with a corresponding contact of the straddle mount MicroSATA plug connector when the straddle mount MicroSATA plug connector is mounted onto substrate 100. In at least one aspect, a straddle mount MicroSAS/MicroSATA plug connector includes a plurality of contacts on opposing sides of a substrate when mounted, wherein a first plurality of contacts is in electrical and physical contact with the substrate on one side of the substrate while a second plurality of contacts is in electrical and physical contact with the substrate on the other side of the substrate. The first plurality of contacts and the second plurality of contacts are separated by a fixed, predetermined distance. An advantage of a straddle mount MicroSAS/MicroSATA plug connector is that it allows for low profile height requirements to be more easily met.

Referring to FIG. 2, in at least one aspect, MicroSAS plug connector 200 is a surface mount MicroSAS plug connector, wherein each conductive pad in the first plurality of conductive pads 102 is configured to make electrical contact with a corresponding contact of the surface mount MicroSAS plug connector when the surface mount MicroSAS plug connector is mounted onto substrate 100. Referring to FIG. 3, in at least one aspect, MicroSATA plug connector 300 is a surface mount MicroSATA plug connector, wherein each conductive pad in the second plurality of conductive pads 102' is configured to make electrical contact with a corresponding contact of the surface mount MicroSATA plug connector when the surface mount MicroSATA plug connector is mounted onto substrate 100. In at least one aspect, a surface mount MicroSAS/MicroSATA plug connector includes a plurality of contacts on one side of a substrate when mounted onto the substrate, such as, e.g., shown in FIG. 2 (for MicroSAS) and FIG. 3 (for MicroSATA). An advantage of a surface mount MicroSAS/MicroSATA plug connector is that it can be easily mounted onto the substrate in an automated assembly process including, e.g., placing the connector onto the substrate using, e.g., an automated pick and place process, and attaching the contacts of the connector to corresponding conductive pads of the substrate using, e.g., an automated solder reflow process. The surface mount MicroSAS/MicroSATA plug connector may be a standard profile surface mount or low profile surface mount MicroSAS/MicroSATA plug connector. In at least one aspect, the profile of a connector may be defined as the distance from a top surface of the substrate on which the connector is mounted to a top surface of the connector. For example, referring to FIG. 2, profile P is defined as the distance from first side 100a of substrate 100 to top surface 200a of MicroSAS plug connector 200. In at least one aspect the height of a connector may be defined as the distance from a top surface of the connector to a bottom surface of the connector. For example, referring to FIG. 2, height H is defined as the distance from top surface 200a to bottom surface 200b of MicroSAS plug connector 200. In at least one aspect, height H of MicroSAS plug connector 200 may be 4 mm as defined in specifications set by the Small Form Factor (SFF) Committee. In at least one aspect, in a standard profile connector, profile P is equal to or greater than height H. In at least one aspect, in a low profile connector, profile P is smaller than height H. In at least one aspect, in a low profile connector, the distance from a top surface of the substrate on which the connector is mounted to datum A of the connector as defined in specifications set by the Small Form Factor (SFF) Committee is 1.29 mm. Although height H if typically fixed, profile P may be selected as suitable for the intended application, e.g., depending on the desired substrate design or connector mounting method. Connector contact tails T may be configured according to the selected profile.

Referring to FIG. 2, in at least one aspect, MicroSAS plug connector 200 is a right angle MicroSAS plug connector, wherein each conductive pad in the first plurality of conductive pads 102 is configured to make electrical contact with a corresponding contact of the right angle MicroSAS plug connector when the right angle MicroSAS plug connector is mounted onto substrate 100. Referring to FIG. 3, in at least one aspect, MicroSATA plug connector 300 is a right angle MicroSATA plug connector, wherein each conductive pad in the second plurality of conductive pads 102' is configured to make electrical contact with a corresponding contact of the right angle MicroSATA plug connector when the right angle MicroSATA plug connector is mounted onto substrate 100. In at least one aspect, a right angle MicroSAS/MicroSATA plug connector includes a mating direction D1 of the connector that is substantially perpendicular to a mounting direction D2 of the connector.

Referring now to FIGS. 4a-4b and FIGS. 5a-5b, in at least one aspect, a plastic cover may be provided with a surface mount connector, such as, e.g., a surface mount MicroSAS plug connector or a surface mount MicroSATA plug connector as described herein. This plastic cover is designed to increase the electrical performance of the connector while allowing an easy process of mounting the connector to a substrate and assembling the plastic cover to the connector. In at least one aspect, the electrical performance increase may include an improvement in controlling the impedance at a desired value, such as, e.g., 100 Ohms differential impedance or 50 Ohms single ended impedance. In one embodiment, with the presence of a plastic cover, the impedance can be controlled at about 90 Ohms at 75 picoseconds (10%-90%). In at least one aspect, the absence of a plastic cover may increase the impedance of the connector. In at least one aspect, the improvement in controlling the impedance at a desired value increases the data rates at which signals can be transmitted through the connector, e.g., to values greater than 6 Gb/s. In at least one aspect, a plastic cover eliminates the need for a more complex connector body design that may complicate the process of inserting electrical contacts in the connector body, complicate mounting the connector to a substrate, and obstruct access to the terminations, e.g., for visual inspection. The plastic cover is an optional component that may be added or omitted as desired for the intended application.

Figure 4A:
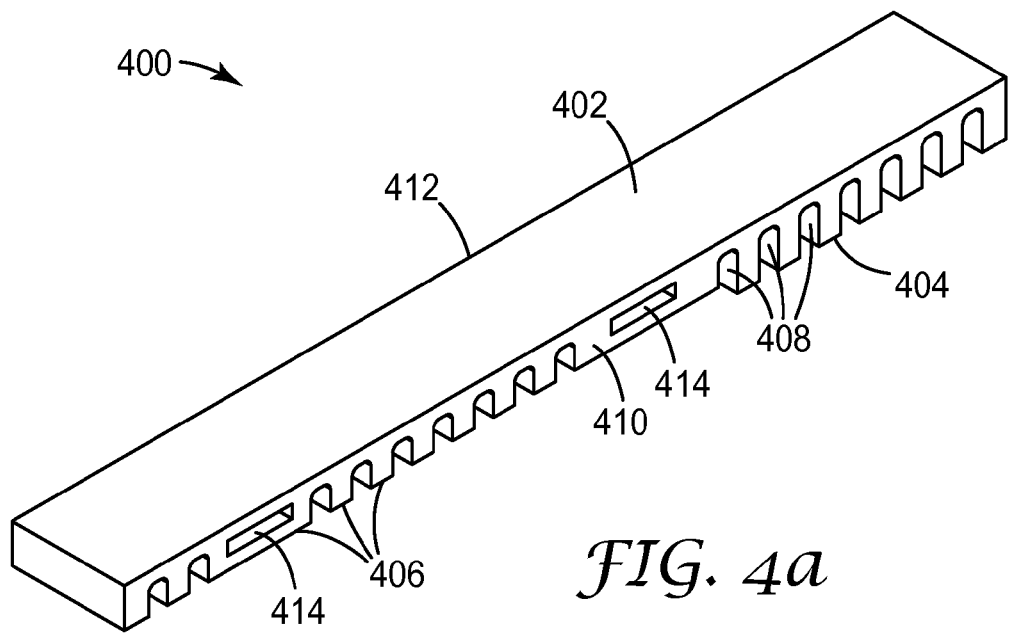
FIGS. 4a and 4b are top and bottom perspective views, respectively, of an exemplary embodiment of a plastic cover according to an aspect of the present invention.
Figure 4B:
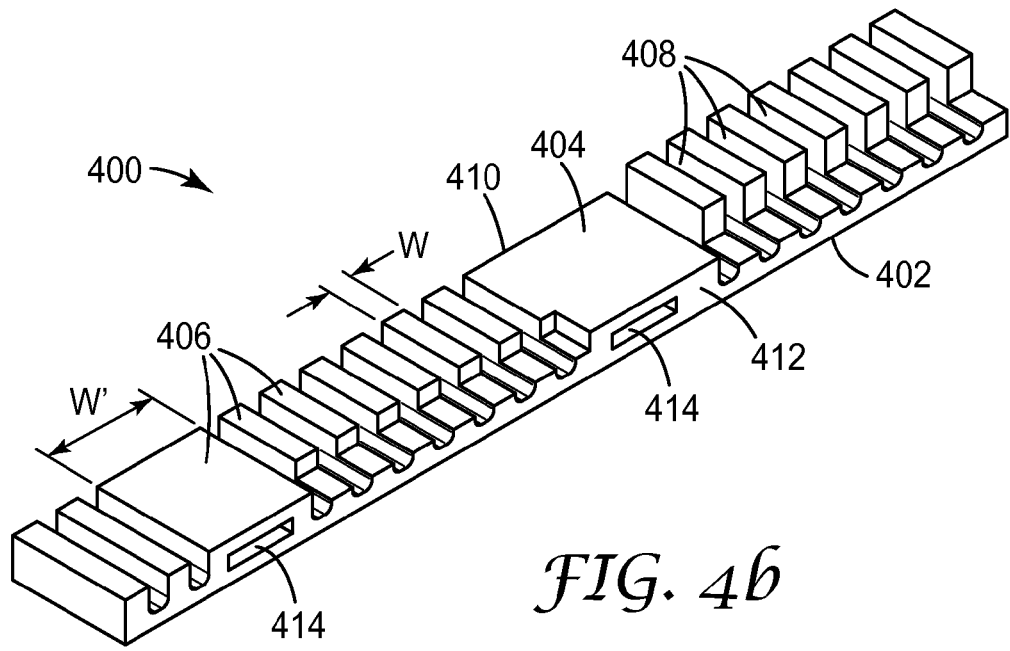

FIGS. 4a-4b illustrate an exemplary embodiment of a plastic cover according to an aspect of the present invention. Plastic cover 400 is configured for covering at least portions of contact tails of a surface mount connector, such as, e.g., contact tails T of MicroSAS plug connector 200 as shown, e.g., in FIG. 2. Plastic cover 400 includes a top surface 402 and a structured bottom surface 404. Structured bottom surface 404 includes a plurality of elongated spaced apart parallel ridges 406. Ridges 406 define a plurality of elongated parallel channels 408 therebetween. In at least one aspect, as can best be seen in FIG. 4b, at least two ridges in the plurality of elongated spaced apart parallel ridges 406 have different widths. In at least one aspect, the different widths correspond to the spacing, or pitch, between individual contacts within a group of contacts, such as e.g., seven power contacts P1-P7 of MicroSAS plug connector 200, represented in FIG. 4b by width w, and between adjacent groups of contacts, such as, e.g., two power contacts P8-P9 and seven power contacts P1-P7 of MicroSAS plug connector 200, represented in FIG. 4b by width w'. In at least one aspect, different widths of ridges 406 may be selected to help control the impedance of the connector at a desired value, such as, e.g., 100 Ohms differential impedance or 50 Ohms single ended impedance. For example, in some aspects, reducing width w may result in a higher impedance value. Channels 408 extend from a front side 410 of plastic cover 400 toward an opposite back side 412 of plastic cover 400. Each channel 408 corresponds to a different contact tail of the surface mount connector. Each channel 408 is configured to cover the contact tail along at least a portion of a length of the contact tail, such that when the surface mount connector is mounted, plastic cover 400 is placed in a position so that back side 412 of plastic cover 400 is near and along a mounting face of the surface mount connector resulting in each contact tail of the surface mount connector being housed within a different channel 408.

Figure 5A:
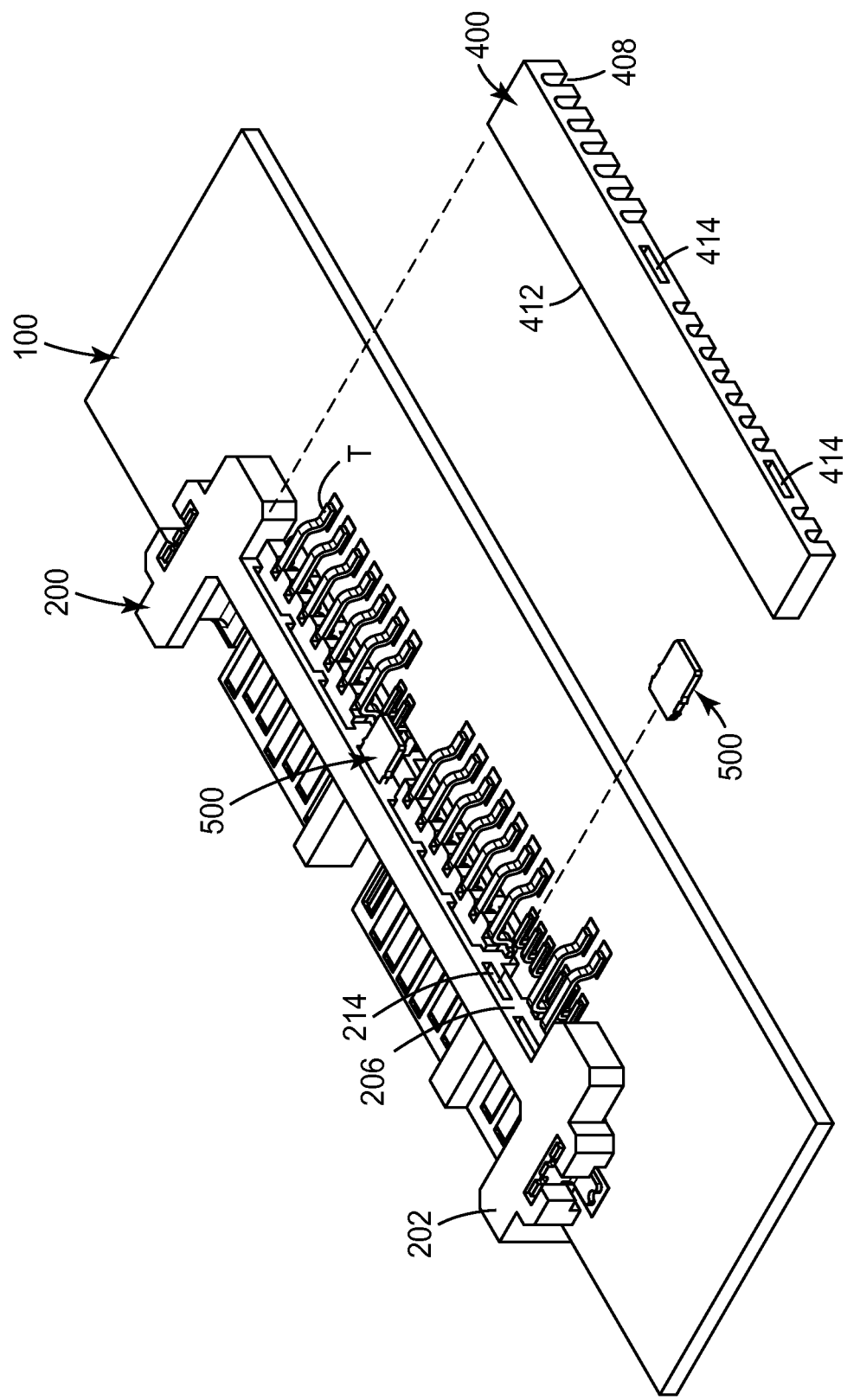
FIGS. 5a and 5b are top partially exploded and unexploded perspective views, respectively, of the plastic cover of FIGS. 4a and 4b assembled to a surface mount connector.
Figure 5B:
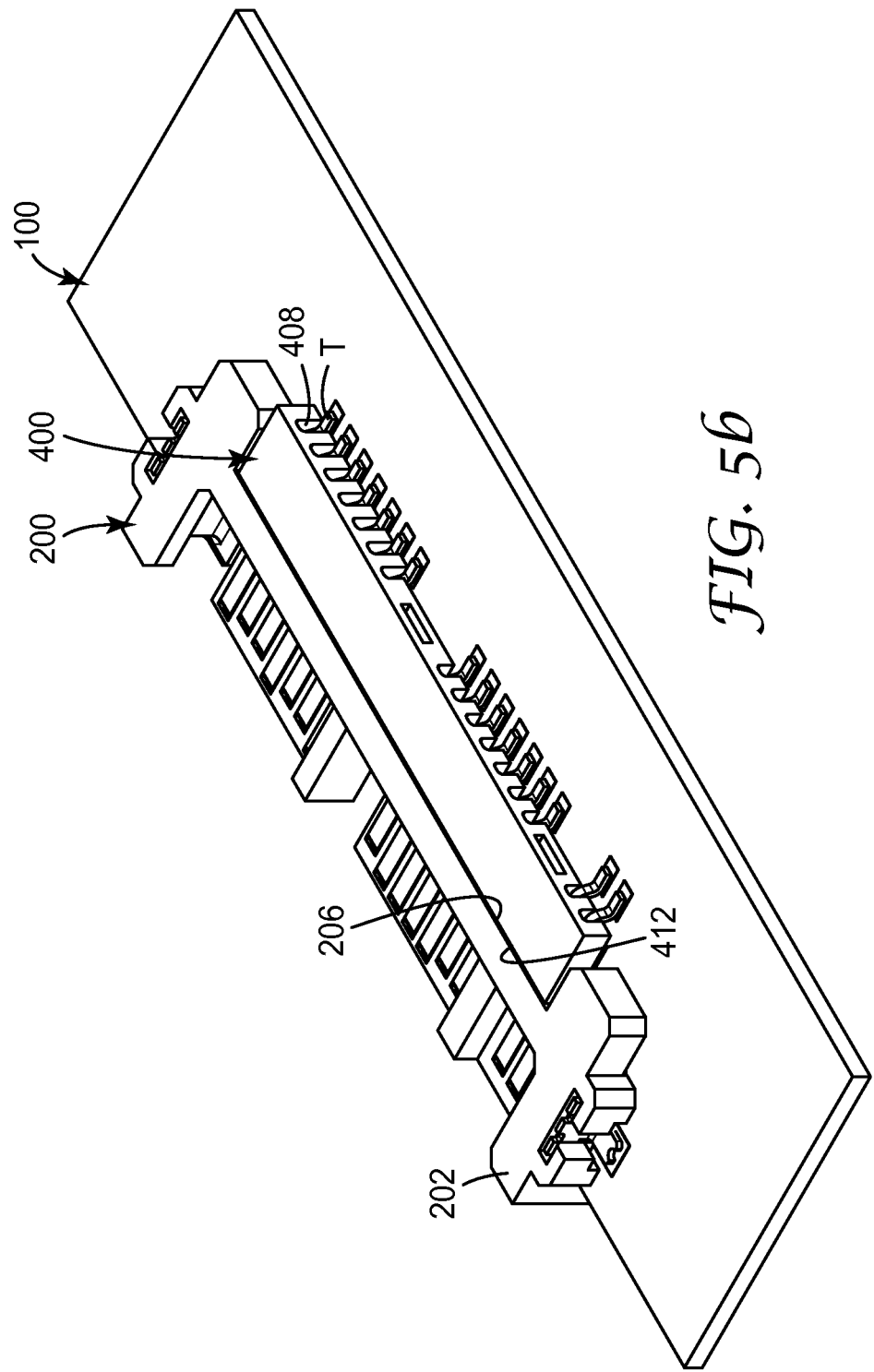

An example of this arrangement of plastic cover 400 with respect to a surface mount connector is illustrated in FIGS. 5a-5b. FIG. 5a illustrates MicroSAS plug connector 200 mounted on substrate 100. Plastic cover 400 is positioned for assembly to MicroSAS plug connector 200. To facilitate the assembly, retention elements 500 are provided to help position and retain plastic cover 400 with respect to MicroSAS plug connector 200. Retention elements 500 are inserted and retained in corresponding slots 214 in connector body 202 of MicroSAS plug connector 200. As can be seen in FIG. 5a, when retention elements are fully inserted in corresponding slots 214 in connector body 202, a portion of each retention element 500 extends from mounting face 206 of MicroSAS plug connector 200. These portions then enter corresponding slots 414 in plastic cover 400 when plastic cover 400 is assembled to MicroSAS plug connector 200 to retain plastic cover 400 in a position so that back side 412 of plastic cover 400 is near and along mounting face 206 of MicroSAS plug connector 200. As a result, as can be seen in FIG. 5b, each contact tail T of MicroSAS plug connector 200 is housed within a different channel 408. In at least one embodiment, retention elements 500 are formed of metal by methods such as molding, casting, stamping, machining, and the like.

In an exemplary assembly process, MicroSAS plug connector 200 is first mounted onto substrate 100. Then, retention elements 500 are inserted in corresponding slots 214 in connector body 202 of MicroSAS plug connector 200. Finally, plastic cover 400 is assembled to MicroSAS plug connector 200. In at least one aspect, these assembly steps can be performed in a semi-automated or fully automated assembly process using semi-automated or fully automated assembly equipment.

In at least one aspect, the same plastic cover 400 can be used for covering at least portions of contact tails T of MicroSATA plug connector 300 as shown, e.g., in FIG. 3, in the same manner as described above with respect to MicroSAS plug connector 200.

Following are exemplary embodiments of a substrate and a plastic cover according to aspects of the present invention.

Embodiment 1 is a substrate comprising: a first plurality of conductive pads disposed on a first side of the substrate, each conductive pad in the first plurality of conductive pads being configured to make electrical contact with a corresponding contact of a MicroSAS plug connector when the MicroSAS plug connector is mounted onto the substrate, there being a one-to-one correspondence between the contacts in the MicroSAS plug connector and the conductive pads in the first plurality of conductive pads; and a different second plurality of conductive pads disposed on the first side of the substrate, each conductive pad in the second plurality of conductive pads being configured to make electrical contact with a corresponding contact of a MicroSATA plug connector when the MicroSATA plug connector is mounted onto the substrate, there being a one-to-one correspondence between the contacts in the MicroSATA plug connector and the conductive pads in the second plurality of conductive pads, at least one conductive pad belonging to both the first and second pluralities of conductive pads.

Embodiment 2 is the substrate of embodiment 1 being a printed circuit board.

Embodiment 3 is the substrate of embodiment 1, wherein each conductive pad in the first and second pluralities of conductive pad is connected to a different conductive trace disposed on the substrate.

Embodiment 4 is the substrate of embodiment 1, wherein each conductive pad in the second plurality of conductive pads is also a conductive pad in the first plurality of conductive pads.

Embodiment 5 is the substrate of embodiment 1, wherein the conductive pads in the first and second pluralities of conductive pads are arranged in first and second rows parallel to a first edge of the substrate, the first row being disposed between the first edge and the second row.

Embodiment 6 is the substrate of embodiment 1, wherein each conductive pad in the first plurality of conductive pads is configured to make electrical contact with a corresponding contact of a straddle mount MicroSAS plug connector when the straddle mount MicroSAS plug connector is mounted onto the substrate.

Embodiment 7 is the substrate of embodiment 1, wherein each conductive pad in the second plurality of conductive pads is configured to make electrical contact with a corresponding contact of a straddle mount MicroSATA plug connector when the straddle mount MicroSATA plug connector is mounted onto the substrate.

Embodiment 8 is the substrate of embodiment 1, wherein each conductive pad in the first plurality of conductive pads is configured to make electrical contact with a corresponding contact of a low profile surface mount MicroSAS plug connector when the low profile surface mount MicroSAS plug connector is mounted onto the substrate.

Embodiment 9 is the substrate of embodiment 1, wherein each conductive pad in the second plurality of conductive pads is configured to make electrical contact with a corresponding contact of a low profile surface mount MicroSATA plug connector when the low profile surface mount MicroSATA plug connector is mounted onto the substrate.

Embodiment 10 is the substrate of embodiment 1, wherein each conductive pad in the first plurality of conductive pads is configured to make electrical contact with a corresponding contact of a standard profile surface mount MicroSAS plug connector when the standard profile surface mount MicroSAS plug connector is mounted onto the substrate.

Embodiment 11 is the substrate of embodiment 1, wherein each conductive pad in the second plurality of conductive pads is configured to make electrical contact with a corresponding contact of a standard profile surface mount MicroSATA plug connector when the standard profile surface mount MicroSATA plug connector is mounted onto the substrate.

Embodiment 12 is the substrate of embodiment 1, wherein each conductive pad in the first plurality of conductive pads is configured to make electrical contact with a corresponding contact of a right angle MicroSAS plug connector when the right angle MicroSAS plug connector is mounted onto the substrate.

Embodiment 13 is the substrate of embodiment 1, wherein each conductive pad in the second plurality of conductive pads is configured to make electrical contact with a corresponding contact of a right angle MicroSATA plug connector when the right angle MicroSATA plug connector is mounted onto the substrate.

Embodiment 14 is a plastic cover for covering at least portions of contact tails of a surface mount connector, the plastic cover comprising a top surface and a structured bottom surface comprising a plurality of elongated spaced apart parallel ridges defining a plurality of elongated parallel channels therebetween, the channels extending from a front side of the plastic cover toward an opposite back side of the plastic cover, each channel corresponding to a different contact tail of the surface mount connector and being configured to cover the contact tail along at least a portion of a length of the contact tail, such that when the surface mount connector is mounted, the plastic cover is placed in a position so that the back side of the plastic cover is near and along a mounting face of the surface mount connector resulting in each contact tail of the surface mount connector being housed within a different channel.

Embodiment 15 is the plastic cover of embodiment 14, wherein at least two ridges in the plurality of elongated spaced apart parallel ridges have different widths.

In each of the embodiments and implementations described herein, the plastic cover and the various components of the substrate and the plug connectors are formed of any suitable material. The materials are selected depending upon the intended application and may include both metals and non-metals (e.g., any one or combination of non-conductive materials including but not limited to polymers, glass, and ceramics). In at least one embodiment, electrically insulative components, such as, e.g., any insulative layers of substrate 100, connector body 202, and plastic cover 400, are formed of a polymeric material by methods such as injection molding, extrusion, casting, machining, and the like, while electrically conductive components, such as, e.g., any conductive layers of substrate 100, conductive pads 102, contacts P1-P9, S1-S14, and A1-A2 of MicroSAS plug connector 200, and contacts P1-P9 and S1-S7 of MicroSATA plug connector 300, are formed of metal by methods such as molding, casting, stamping, machining, and the like. Material selection will depend upon factors including, but not limited to, chemical exposure conditions, environmental exposure conditions including temperature and humidity conditions, flame-retardancy requirements, material strength, and rigidity, to name a few.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A substrate comprising:
   a first plurality of conductive pads disposed on a first side of the substrate, each conductive pad in the first plurality of conductive pads being configured to make electrical contact with a corresponding contact of a MicroSAS plug connector when the MicroSAS plug connector is mounted onto the substrate, there being a one-to-one correspondence between the contacts in the MicroSAS plug connector and the conductive pads in the first plurality of conductive pads; and
   a different second plurality of conductive pads disposed on the first side of the substrate, each conductive pad in the second plurality of conductive pads being configured to make electrical contact with a corresponding contact of a MicroSATA plug connector when the MicroSATA plug connector is mounted onto the substrate, there being a one-to-one correspondence between the contacts in the MicroSATA plug connector and the conductive pads in the second plurality of conductive pads, at least one conductive pad belonging to both the first and second pluralities of conductive pads.

2. The substrate of claim 1 being a printed circuit board.

3. The substrate of claim 1, wherein each conductive pad in the first and second pluralities of conductive pad is connected to a different conductive trace disposed on the substrate.

4. The substrate of claim 1, wherein each conductive pad in the second plurality of conductive pads is also a conductive pad in the first plurality of conductive pads.

5. The substrate of claim 1, wherein the conductive pads in the first and second pluralities of conductive pads are arranged in first and second rows parallel to a first edge of the substrate, the first row being disposed between the first edge and the second row.

6. The substrate of claim 1, wherein each conductive pad in the first plurality of conductive pads is configured to make electrical contact with a corresponding contact of a straddle mount MicroSAS plug connector when the straddle mount MicroSAS plug connector is mounted onto the substrate.

7. The substrate of claim 1, wherein each conductive pad in the second plurality of conductive pads is configured to make electrical contact with a corresponding contact of a straddle mount MicroSATA plug connector when the straddle mount MicroSATA plug connector is mounted onto the substrate.

8. The substrate of claim 1, wherein each conductive pad in the first plurality of conductive pads is configured to make electrical contact with a corresponding contact of a low profile surface mount MicroSAS plug connector when the low profile surface mount MicroSAS plug connector is mounted onto the substrate.

9. The substrate of claim 1, wherein each conductive pad in the second plurality of conductive pads is configured to make electrical contact with a corresponding contact of a low profile surface mount MicroSATA plug connector when the low profile surface mount MicroSATA plug connector is mounted onto the substrate.

10. The substrate of claim 1, wherein each conductive pad in the first plurality of conductive pads is configured to make electrical contact with a corresponding contact of a standard profile surface mount MicroSAS plug connector when the standard profile surface mount MicroSAS plug connector is mounted onto the substrate.

11. The substrate of claim 1, wherein each conductive pad in the second plurality of conductive pads is configured to make electrical contact with a corresponding contact of a standard profile surface mount MicroSATA plug connector when the standard profile surface mount MicroSATA plug connector is mounted onto the substrate.

12. The substrate of claim 1, wherein each conductive pad in the first plurality of conductive pads is configured to make electrical contact with a corresponding contact of a right angle MicroSAS plug connector when the right angle MicroSAS plug connector is mounted onto the substrate.

13. The substrate of claim 1, wherein each conductive pad in the second plurality of conductive pads is configured to make electrical contact with a corresponding contact of a right angle MicroSATA plug connector when the right angle MicroSATA plug connector is mounted onto the substrate.

14. A plastic cover for covering at least portions of contact tails of a surface mount connector, the plastic cover comprising a top surface and a structured bottom surface comprising a plurality of elongated spaced apart parallel ridges defining a plurality of elongated parallel channels therebetween, the channels extending from a front side of the plastic cover toward an opposite back side of the plastic cover, each channel corresponding to a different contact tail of the surface mount connector and being configured to cover the contact tail along at least a portion of a length of the contact tail, such that when the surface mount connector is mounted, the plastic cover is placed in a position so that the back side of the plastic cover is near and along a mounting face of the surface mount connector resulting in each contact tail of the surface mount connector being housed within a different channel.

15. The plastic cover of claim 14, wherein at least two ridges in the plurality of elongated spaced apart parallel ridges have different widths.

\* \* \* \* \*